United States Patent
Yang et al.

(10) Patent No.: US 9,530,755 B2
(45) Date of Patent: Dec. 27, 2016

(54) SEMICONDUCTOR PACKAGES

(71) Applicant: Samsung Electronics Co., Ltd., Suwon-si, Gyeonggi-do (KR)

(72) Inventors: Seung-Yeol Yang, Asan-si (KR); Jonggi Lee, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/108,331

(22) Filed: Dec. 16, 2013

(65) Prior Publication Data

US 2014/0239515 A1 Aug. 28, 2014

(30) Foreign Application Priority Data

Feb. 25, 2013 (KR) .................. 10-2013-0019829

(51) Int. Cl.
*H01L 25/065* (2006.01)
*H01L 23/31* (2006.01)
*H01L 23/00* (2006.01)

(52) U.S. Cl.
CPC ....... *H01L 25/0657* (2013.01); *H01L 23/3128* (2013.01); *H01L 24/73* (2013.01); *H01L 2224/32145* (2013.01); *H01L 2224/32225* (2013.01); *H01L 2224/48227* (2013.01); *H01L 2224/73265* (2013.01); *H01L 2225/0651* (2013.01); *H01L 2225/06562* (2013.01); *H01L 2225/06568* (2013.01); *H01L 2924/15311* (2013.01); *H01L 2924/3511* (2013.01)

(58) Field of Classification Search
CPC ........................... H01L 25/0657; H01L 25/043

USPC ......................................................... 257/778
See application file for complete search history.

(56) References Cited

U.S. PATENT DOCUMENTS

| | | | |
|---|---|---|---|
| 5,229,960 A * | 7/1993 | De Givry | H01L 25/0652 257/E25.011 |
| 6,303,998 B1 | 10/2001 | Murayama | |
| 6,747,331 B2 | 6/2004 | Infantolino et al. | |
| 7,714,427 B2 | 5/2010 | Wong et al. | |
| 8,013,403 B2 | 9/2011 | Katsumata et al. | |
| 2004/0012086 A1 | 1/2004 | Infantolino et al. | |
| 2007/0057381 A1 | 3/2007 | Wong et al. | |
| 2007/0287227 A1* | 12/2007 | Huddleston et al. | 438/109 |
| 2009/0001574 A1* | 1/2009 | Fang | H01L 24/27 257/738 |
| 2010/0025783 A1 | 2/2010 | Katsumata et al. | |

(Continued)

FOREIGN PATENT DOCUMENTS

| | | |
|---|---|---|
| JP | H06053272 | 2/1994 |
| JP | H09115937 A | 5/1997 |

*Primary Examiner* — Marc Armand
(74) *Attorney, Agent, or Firm* — Renaissance IP Law Group LLP

(57) ABSTRACT

Provided is a semiconductor package including a substrate, a first semiconductor chip disposed on the substrate to have a rectangular shape with long and short sides, and a second semiconductor chip disposed on the first semiconductor chip to have a rectangular shape with long and short sides. Centers of the first and second semiconductor chips may be located at substantially the same position as that of the substrate, and the long side of the first semiconductor chip may be substantially parallel to a diagonal line of the substrate. Further, the long side of the second semiconductor chip may be not parallel to that of the first semiconductor chip.

12 Claims, 5 Drawing Sheets

(56) References Cited

U.S. PATENT DOCUMENTS

2012/0001347 A1 1/2012 Lee et al.
2012/0125796 A1 5/2012 Falcon
2013/0168871 A1* 7/2013 Kim et al. .................. 257/774

* cited by examiner

SEMICONDUCTOR PACKAGES

CROSS-REFERENCE TO RELATED APPLICATIONS

This U.S. non-provisional patent application claims priority under 35 U.S.C. §119 to Korean Patent Application No. 10-2013-0019829, filed on Feb. 25, 2013, in the Korean Intellectual Property Office, the entire contents of which are hereby incorporated by reference.

BACKGROUND OF THE INVENTION

Example embodiments of the inventive concept relate to a semiconductor package, and in particular, to a flip-chip package device.

Semiconductor packages become smaller and smaller to satisfy consumer demands for electronic devices. For example, a molding part of the semiconductor package becomes thinner and thinner, and furthermore, the semiconductor package may be configured to have an asymmetric structure. As a result, technical problems, such as twist or warpage, may occur in the semiconductor package.

SUMMARY

Example embodiments of the inventive concept provide a semiconductor package configured to suppress twist or warpage from occurring.

According to example embodiments of the inventive concepts, a semiconductor package may include a substrate, a first semiconductor chip disposed on the substrate to have a rectangular shape with long and short sides, and a second semiconductor chip disposed on the first semiconductor chip to have a rectangular shape with long and short sides. Centers of the first and second semiconductor chips may be located at substantially the same position as that of the substrate, the long side of the first semiconductor chip may be substantially parallel to a diagonal line of the substrate, and the long side of the second semiconductor chip may be not parallel to that of the first semiconductor chip.

In example embodiments, the long side of the second semiconductor chip may be perpendicular to that of the first semiconductor chip.

In example embodiments, the long and short sides of the first and second semiconductor chips may be not parallel to sides of the substrate.

In example embodiments, the first and second semiconductor chips have substantially the same size and substantially the same shape.

In example embodiments, the semiconductor package may further include a third semiconductor chip disposed between the first and second semiconductor chips to have substantially the same size and shape as those of the first semiconductor chip. The third semiconductor chip may be overlapped with the first semiconductor chip, in plan view.

According to example embodiments of the inventive concepts, a semiconductor package may include a substrate shaped like a rectangle, when viewed in plan, and a plurality of semiconductor chips stacked on the substrate and shaped like a rectangle, when viewed in plan. Centers of the plurality of semiconductor chips may be located at substantially the same position as that of the substrate, at least one of the plurality of semiconductor chips has a long side that may be substantially parallel to a diagonal line of the substrate.

In example embodiments, the at least one semiconductor chip, whose long side may be substantially parallel to the diagonal line of the substrate, may be closer to the substrate than the others of the plurality of semiconductor chips.

In example embodiments, all sides of the semiconductor chips may not be parallel to sides of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
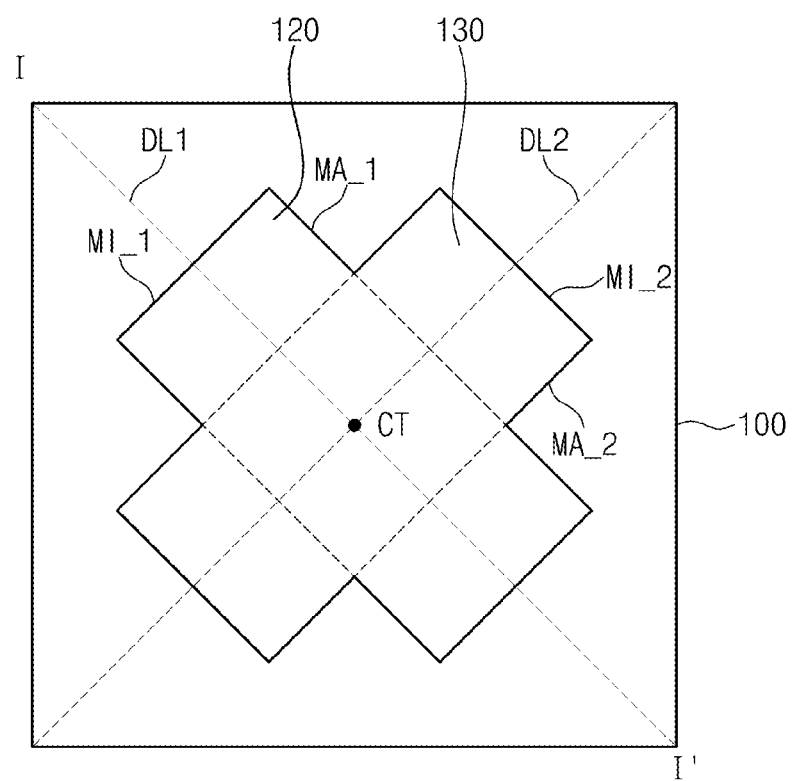
FIGS. 1A and 1B are plan and sectional views illustrating a semiconductor package according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
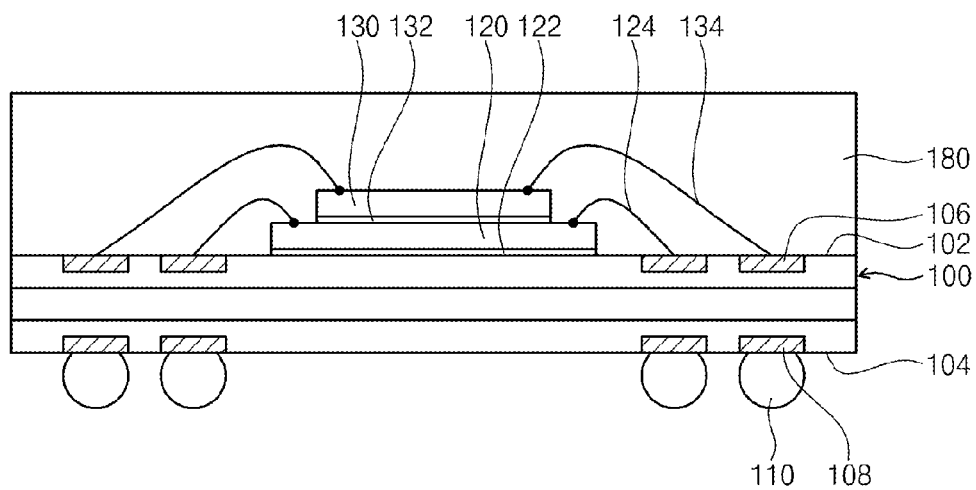

FIGS. 1A and 1B are plan and sectional views illustrating a semiconductor package according to example embodiments of the inventive concept. FIG. 1B is a sectional view taken along a diagonal direction (e.g., a dotted line I-I') of FIG. 1.

Referring to FIGS. 1A and 1B, a semiconductor package may include a substrate 100, a first semiconductor chip 120, and a second semiconductor chip 130.

The substrate 100 may be a printed circuit board (PCB). In plan view, the substrate 100 may shaped like a rectangle or a square. In example embodiments, two diagonal lines DL1 and DL2 may intersect with each other at a center of the substrate 100.

The substrate 100 may include a first surface 102 and a second surface 104 facing each other. In example embodiments, the first semiconductor chip 120 may be provided on the first surface 102, and outer terminals 110 may be provided on the second surface 104.

The substrate 100 may include a chip-mounting region, which is located near a center of the first surface 102 and on which the first semiconductor chip 120 is provided. First pads 106 may be provided on the first surface 102 of the substrate 100. In example embodiments, the first pads 106 may be provided around or adjacent to the chip-mounting region.

Second pads 108 may be provided on the second surface 104 of the substrate 100 and be electrically connected to the outer terminals 110. The outer terminals 110 may be solder balls.

The first semiconductor chip 120 may be attached to the chip-mounting region of the substrate 100 by a die-adhesive film (DAF) 122. The first semiconductor chip 120 may be electrically connected to the first pads 106 via first bonding wires 124.

In example embodiments, when viewed in plan, the first semiconductor chip 120 may be shaped like a rectangle including two opposite long sides MA_1 and two opposite short sides MI_1.

According to example embodiments of the inventive concept, the first semiconductor chip 120 may be disposed on a central region of the substrate 100. A center CT of the first semiconductor chip 120 may be located at the same position as that of the substrate 100. Further, the first semiconductor chip 120 may be disposed to have the long side MA_1 thereof substantially parallel to the diagonal line DL1 of the substrate 100.

For example, the first semiconductor chip 120 may be disposed on the substrate 100 in such a way that a line connecting centers of the two opposite short sides MI_1 of the first semiconductor chip 120 is exactly positioned on the diagonal line DL1 of the substrate 100.

The twist or warpage of the semiconductor package may occur at corners of the substrate 100. However, according to example embodiments of the inventive concept, the long side MA_1 of the first semiconductor chip 120 may be parallel to the diagonal line DL1 of the substrate 100, and this makes it possible to increase a binding force to be exerted to the first semiconductor chip 120 along the direction of the diagonal line DL1 of the substrate 100. Accordingly, it is possible to suppress the twist or warpage from occurring on the semiconductor package.

The second semiconductor chip 130 may be attached on the first semiconductor chip 120 by a DAF 132. Further, the second semiconductor chip 130 may be electrically connected to the first pads 106 of the substrate 100 via second bonding wires 134.

When viewed in plan, the second semiconductor chip 130 may be shaped like a rectangle including two opposite long sides MA_2 and two opposite short sides MI_2.

According to example embodiments of the inventive concept, a center CT of the second semiconductor chip 130 may be located at substantially the same position as that of the first semiconductor chip 120. The long side MA_2 of the second semiconductor chip 130 may not be parallel to the long side MA_1 of the first semiconductor chip 120. For example, the long side MA_2 of the second semiconductor chip 130 may be at an angle of about 1-179° to the long side MA_1 of the first semiconductor chip 120.

In example embodiments, the long side MA_2 of the second semiconductor chip 130 may be substantially perpendicular to the long side MA_1 of the first semiconductor chip 120. In this case, the line connecting the centers of the two opposite short sides MI_1 of the first semiconductor chip 120 is exactly positioned on the diagonal line DL2 of the substrate 100.

Since the second semiconductor chip 130 is rotated with a specific rotation angle on the first semiconductor chip 120, it is possible to suppress the twist or warpage of the substrate 100 disposed therebelow from occurring. In the case where the long side MA_2 of the second semiconductor chip 130 is perpendicular to the long side MA_1 of the first semiconductor chip 120, it is possible to more efficiently suppress the twist or warpage of the semiconductor package from occurring.

The semiconductor package may further include a molding part 180 provided on the substrate 100 to cover and protect the first and second semiconductor chips 120 and 130.

A size of the semiconductor package can be reduced by decreasing a thickness of the molding part 180, but such a decrease in thickness of the molding part 180 may result in a failure (e.g., twist or warpage) of the semiconductor package. By contrast, according to disposition of the first and second semiconductor chips 120 and 130, it is possible to reduce or minimize such a failure.

Figure 2:
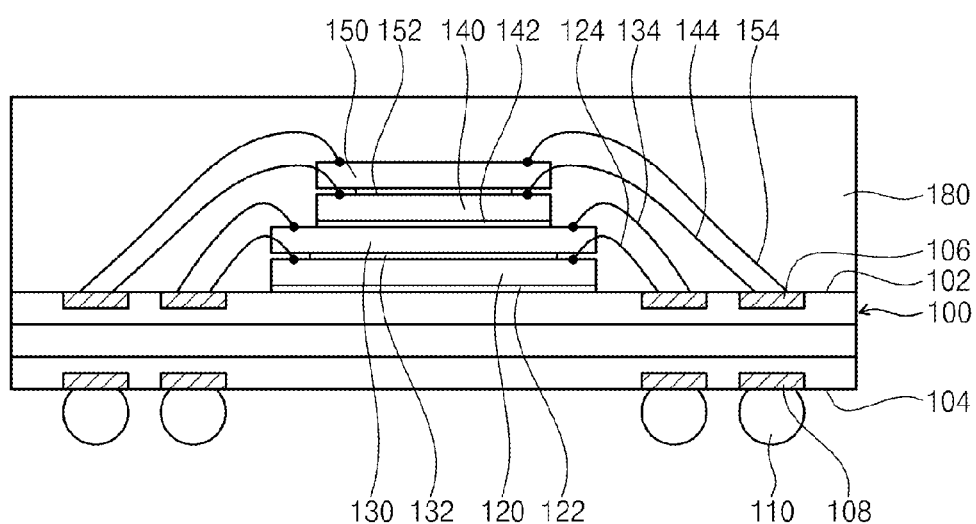
FIG. 2 is a sectional view illustrating a semiconductor package according to other example embodiments of the inventive concept.

FIG. 2 is a sectional view illustrating a semiconductor package according to other example embodiments of the inventive concept. For the sake of brevity, the elements and features of this example that are similar to those previously shown and described will not be described in much further detail.

Referring to FIG. 2, a semiconductor package may include the substrate 100 and a plurality of semiconductor chips mounted on the substrate 100.

For the sake of simplicity, the description that follows will refer to an example of the present embodiment in which four semiconductor chips are mounted on the substrate 100, but example embodiments of the inventive concepts may not be limited thereto. For example, a first semiconductor chip 120, a second semiconductor chip 130, a third semiconductor chip 140, and a fourth semiconductor chip 150 are sequentially stacked on the substrate 100.

In example embodiments, the first to fourth semiconductor chips 120, 130, 140, and 150 may have substantially the same size and substantially the same shape. For example, when viewed in plan, the first semiconductor chip 120 may be shaped like a rectangle including two opposite long sides MA_1 and two opposite short sides MI_1, as described with reference to FIG. 1A.

The first semiconductor chip 120 may be attached on the substrate 100 by the die-adhesive film (DAF) 122. The long side MA of the first semiconductor chip 120 may be substantially parallel to the diagonal line DL1 of the substrate 100 as shown in FIG. 1A. Further, the center CT of the first semiconductor chip 120 may be located at the same position as that of the substrate 100 as shown in FIG. 1A.

The second semiconductor chip 130 may be attached on the first semiconductor chip 120 by the DAF 132. The second semiconductor chip 130 may be overlapped with the first semiconductor chip 120, in plan view.

The third semiconductor chip 140 may be attached on the second semiconductor chip 130 by a DAF 142. The third semiconductor chip 140 may be rotated with respect to the second semiconductor chip 130, and thus, long sides thereof may form a predetermined angle. In example embodiments, the long side of the third semiconductor chip 140 may be substantially perpendicular to that of the second semiconductor chip 130. In this case, the long side of the third semiconductor chip 140 may be substantially parallel to the diagonal line DL2 of the substrate. Further, a center of the third semiconductor chip 140 may be located at substantially the same position as that of the second semiconductor chip 130.

The fourth semiconductor chip 150 may be attached on the third semiconductor chip 140 by a DAF 152. The fourth semiconductor chip 150 may be overlapped with the third semiconductor chip 140, in plan view.

The first to fourth semiconductor chips 120, 130, 140, and 150 may be disposed in such a way that their sides are not parallel to sides of the substrate 100.

The first to fourth semiconductor chips 120, 130, 140, and 150 may be electrically connected to the substrate 100 using bonding wires 124, 134, 144, and 154, respectively.

The semiconductor package may further include the molding part 180 provided on the substrate 100 to cover or protect the first to fourth semiconductor chips 120, 130, 140, and 150.

In example embodiments, the first and second semiconductor chips 120 and 130 may be disposed in such a way that the long sides thereof are substantially parallel to the diagonal line DL1 of the substrate 100, and the third and fourth semiconductor chips 140 and 150 may be disposed in such a way that the long sides thereof are substantially parallel to the diagonal line DL2 of the substrate 100. This makes it possible to increase a binding force exerted to the corners of the substrate 100 from the first to fourth semiconductor chips 120, 130, 140, and 150. Accordingly, it is possible to suppress the twist or warpage from occurring in the semiconductor package.

Figure 3:
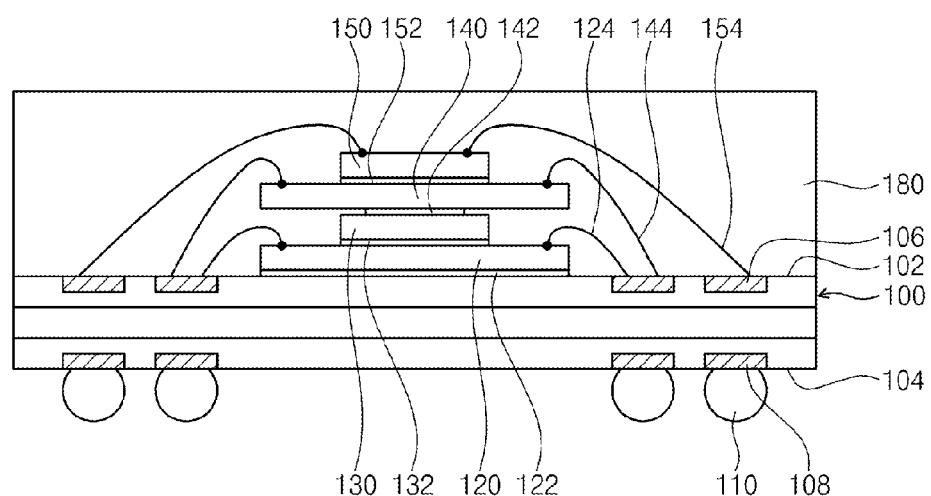
FIG. 3 is a sectional view illustrating a semiconductor package according to still other example embodiments of the inventive concept.

FIG. 3 is a sectional view illustrating a semiconductor package according to still other example embodiments of the inventive concept. For the sake of brevity, the elements and features of this example that are similar to those previously shown and described will not be described in much further detail.

Referring to FIG. 3, a semiconductor package may include the substrate 100 and a plurality of semiconductor chips mounted on the substrate 100.

For the sake of simplicity, the description that follows will refer to an example of the present embodiment in which four semiconductor chips are mounted on the substrate 100, but example embodiments of the inventive concepts may not be limited thereto. For example, a first semiconductor chip 120, a second semiconductor chip 130, a third semiconductor chip 140, and a fourth semiconductor chip 150 are sequentially stacked on the substrate 100.

The semiconductor package of FIG. 3 may differ from that of FIG. 2 in terms of dispositions of the first to fourth semiconductor chips 120, 130, 140, and 150, but except for this difference, the semiconductor package of FIG. 3 may be configured to have substantially the same features as those of the previous embodiments described with reference to FIGS. 1A, 1B, and 2.

As shown in FIG. 1A, the first semiconductor chip 120 may be disposed on the substrate 100, in such a way that the long side MA_1 thereof is substantially parallel to the diagonal line DL1 of the substrate 100. The center CT of the first semiconductor chip 120 may be located at substantially the same position as that of the substrate 100.

The second semiconductor chip 130 may be disposed on the first semiconductor chip 120 in such a way that the long side MA_2 thereof is not parallel to the long side MA_1 of the first semiconductor chip 120. In example embodiments, the second semiconductor chip 130 may be disposed in such a way that the long side MA_2 thereof forms a predetermined angle with respect to the long side MA_1 of the first semiconductor chip 120. For example, the long side MA_2 of the second semiconductor chip 130 may be substantially perpendicular to the long side MA_1 of the first semiconductor chip 120. In addition, the center of the second semiconductor chip 130 may be located at substantially the same position as that of the first semiconductor chip 120.

The third semiconductor chip 140 may be disposed on the second semiconductor chip 130 in such a way that the long side thereof is not parallel to that of the second semiconductor chip 130. In example embodiments, the third semiconductor chip 140 may be disposed in such a way that the long side thereof forms a predetermined angle with respect to the long side of the second semiconductor chip 130. For example, the long side of the third semiconductor chip 140 may be substantially perpendicular to the long side of the second semiconductor chip 130. The third semiconductor chip 140 may be disposed to be overlapped with the first semiconductor chip 120, in plan view. In addition, the center of the third semiconductor chip 140 may be located at substantially the same position as that of the second semiconductor chip 130.

The fourth semiconductor chip 150 may be disposed on the third semiconductor chip 140 in such a way that the long side thereof is not parallel to that of the third semiconductor chip 140. In example embodiments, the fourth semiconductor chip 150 may be disposed in such a way that the long side thereof forms a predetermined angle with respect to the third semiconductor chip 140. For example, the long side of the fourth semiconductor chip 150 may be substantially perpendicular to the long side of the third semiconductor chip 140. In other embodiments, the fourth semiconductor chip 150 may be disposed to be overlapped with the second semiconductor chip 130, in plan view. In addition, the center of the fourth semiconductor chip 150 may be located at substantially the same position as that of the third semiconductor chip 140.

The first to fourth semiconductor chips 120, 130, 140, and 150 may be disposed in such a way that their sides are not parallel to sides of the substrate 100.

In example embodiments, the first and third semiconductor chips 120 and 140 may be disposed in such a way that the long sides thereof are substantially parallel to the diagonal line DL1 of the substrate 100, and the second and fourth semiconductor chips 130 and 150 may be disposed in such a way that the long sides thereof are substantially parallel to the diagonal line DL2 of the substrate 100. This makes it possible to increase a binding force exerted to the corners of the substrate 100 from the first to fourth semiconductor chips 120, 130, 140, and 150. Accordingly, it is possible to suppress the twist or warpage from occurring in the semiconductor package.

Figure 4A:
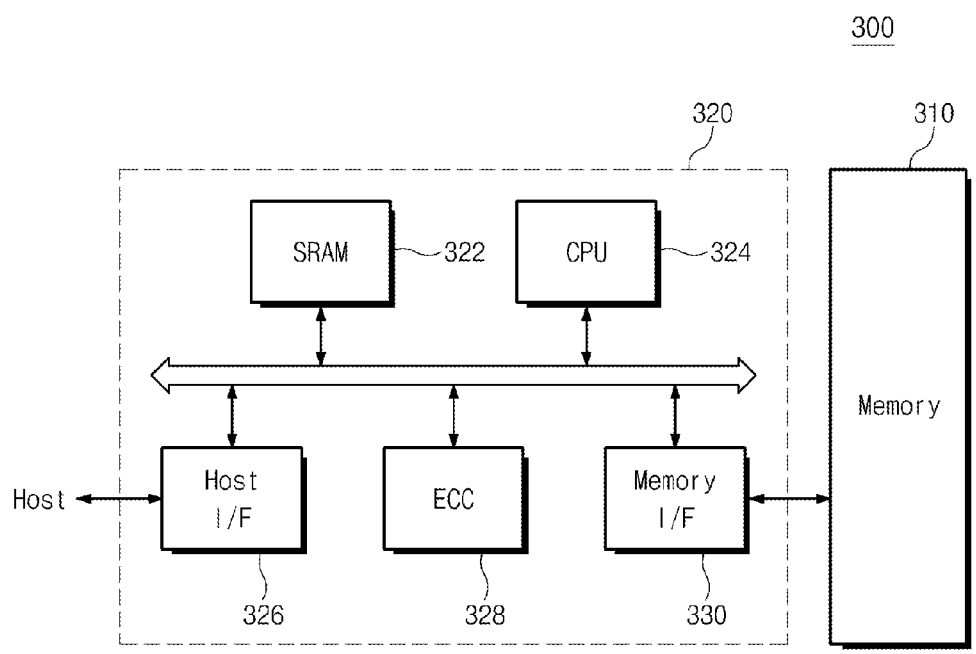
FIG. 4A is a schematic block diagram illustrating an example of memory cards including a semiconductor device according to example embodiments of the inventive concept.

FIG. 4A is a schematic block diagram illustrating an example of memory cards including a semiconductor device according to example embodiments of the inventive concept.

Referring to FIG. 4A, a semiconductor device according to exemplary embodiments of the inventive concept may be applied to form a memory card 300. The memory card 300 may include a memory controller 320 to control a data exchange between a host and a semiconductor device 310. A static random access memory 322 may be used as an operation memory of a central processing unit 324. A host interface 326 may include at least one data exchange protocol of the host connected to the memory card 300. An error correction code 328 may detect and correct at least one error that may be included in data read from the semiconductor device 310. A memory interface 330 can interface with the semiconductor device 310. The central processing unit 324 can control data exchange of the memory controller 320 with, for example, the semiconductor device 310.

The semiconductor device 310 applied to realize the memory card 300 may be configured to have substantially the same technical features as those according to example embodiments of the inventive concept, and thus, it is possible to suppress twist or warpage from occurring in the semiconductor package and thereby to improve structural stability of the semiconductor device 310.

Figure 4B:
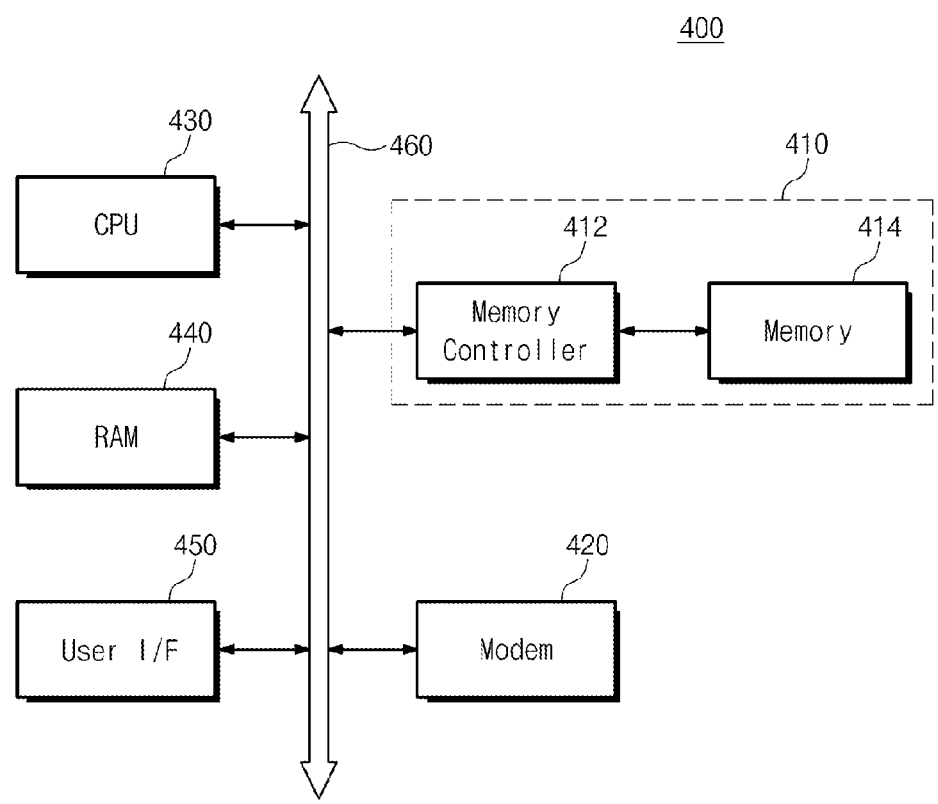
FIG. 4B is a schematic block diagram illustrating an example of information processing systems including a semiconductor device according to example embodiments of the inventive concept.

FIG. 4B is a schematic block diagram illustrating an example of information processing systems including a semiconductor device according to example embodiments of the inventive concept.

Referring to FIG. 4B, an information processing system 400 may include a semiconductor device according to exemplary embodiments of the inventive concept. The information processing system 400 may include a mobile device or a computer. As an illustration, the information processing system 400 may include the memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 may be the same as the memory card 300 described with reference to FIG. 4A. The information processing system 400 may be provided as a memory card, a solid state disk, a camera image sensor and an application chip set. For example, the memory system 410 may be a solid state disk (SSD). The information processing system 400 may stably and reliably store data in the memory system 410.

According to example embodiments of the inventive concept, the first semiconductor chip may be disposed in such a way that a long side thereof is parallel to the diagonal line of the substrate but is not parallel to the long side of the second semiconductor chip. This makes it possible to suppress the twist or warpage from occurring in the semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor package, comprising:
    a substrate;
    a first semiconductor chip disposed on the substrate and having a rectangular shape with a long side and a short side;
    a second semiconductor chip disposed on the first semiconductor chip and having a rectangular shape with a long side and a short side; and
    a third semiconductor chip disposed on the second semiconductor chip and having substantially the same size and shape as the first semiconductor chip;
    wherein:
        the long side of the first semiconductor chip and the long side of the second semiconductor chip are rotated relative to each other; and
        the long side of the first semiconductor chip is substantially parallel to a first diagonal line extending from a first corner of the substrate to a second corner of the substrate;
        the long side of the second semiconductor chip is substantially parallel to a second diagonal line extending from a third corner of the substrate to a fourth corner of the substrate;
        the first diagonal line is not parallel to the second diagonal line;
        the third semiconductor chip substantially overlaps the first semiconductor chip; and
        all sides of all semiconductor chips stacked on the substrate are not parallel to sides of the substrate.

2. The semiconductor package of claim 1, wherein centers of the first and second semiconductor chips are located at substantially the same position.

3. The semiconductor package of claim 1, wherein centers of the first semiconductor chip, the second semiconductor chip, and the substrate are located at substantially the same position.

4. The semiconductor package of claim 1, wherein the long side of the second semiconductor chip is substantially perpendicular to the long side of the first semiconductor chip.

5. The semiconductor package of claim 1, wherein the long and short sides of the first and second semiconductor chips are not parallel to sides of the substrate.

6. The semiconductor package of claim 1, wherein the first and second semiconductor chips have substantially the same size and substantially the same shape.

7. The semiconductor package of claim 1, further comprising, a fourth semiconductor chip disposed between the first and second semiconductor chips and having substantially the same size and shape as the first semiconductor chip,
    wherein the fourth semiconductor chip substantially overlaps the first semiconductor chip.

8. The semiconductor package of claim 1, wherein an angle between the long side of the first semiconductor chip and the long side of the second semiconductor chip is greater than 45 degrees and less than 135 degrees.

9. A semiconductor package, comprising:
    a substrate having a substantially rectangular surface; and
    a plurality of semiconductor chips stacked on the surface of the substrate, each semiconductor chip having a substantially rectangular shape;
    wherein:
        centers of the plurality of semiconductor chips and the substrate are substantially aligned;
        at least one of the plurality of semiconductor chips has a long side that is substantially parallel to a diagonal line of the substrate extending from a first corner of the substrate to a second, opposite corner of the substrate;
        at least one of the plurality of semiconductor chips has substantially the same size, shape, and rotation as another one of the plurality of semiconductor chips; and
        all sides of all semiconductor chips stacked on the substrate are not parallel to sides of the substrate.

10. The semiconductor package of claim 9, wherein the at least one semiconductor chip having the long side that is substantially parallel to the diagonal line of the substrate is closer to the substrate than the others of the plurality of semiconductor chips.

11. A semiconductor package, comprising:
    a substrate;
    a first semiconductor chip disposed on the substrate and having a rectangular shape with a long side and a short side;
    a second semiconductor chip disposed on the first semiconductor chip and having a rectangular shape with a long side and a short side; and
    a third semiconductor chip disposed on the second semiconductor chip and having substantially the same size, shape, and rotation as the first semiconductor chip;
    wherein:
        the long side of the first semiconductor chip and the long side of the second semiconductor chip are rotated relative to each other;
        the long and short sides of the first and second semiconductor chips are not parallel to sides of the substrate; and
        all sides of all semiconductor chips stacked on the substrate are not parallel to sides of the substrate.

12. The semiconductor package of claim 11, wherein an angle between the long side of the first semiconductor chip and the long side of the second semiconductor chip is greater than 45 degrees and less than 135 degrees.

* * * * *